(12) United States Patent
Okabe (10) Patent No.: US 8,373,461 B2
(45) Date of Patent: Feb. 12, 2013

(54) PLL FREQUENCY SYNTHESIZER (75) Inventor: Hideyuki Okabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 92 days.

(21) Appl. No.: 13/104,851

(22) Filed: May 10, 2011

(65) Prior Publication Data

US 2011/0285435 A1 Nov. 24, 2011

(30) Foreign Application Priority Data

May 19, 2010 (JP) .................. 2010-115617

(51) Int. Cl.
*H03L 7/06* (2006.01)
(52) U.S. Cl. ............ 327/156; 327/157; 331/18; 331/25; 331/34; 375/373; 375/375
(58) Field of Classification Search .......... 327/156–157; 331/18, 19, 25, 34; 375/373–376
See application file for complete search history.

(56) References Cited

FOREIGN PATENT DOCUMENTS

JP 10-223629 2/2000

*Primary Examiner* — Lincoln Donovan
*Assistant Examiner* — Shikha Goyal
(74) *Attorney, Agent, or Firm* — Ladas & Parry, LLP (57) ABSTRACT

A VCO oscillates at a frequency that corresponds to a control voltage. A frequency mixer performs frequency mixing of the output signal of the VCO and a local signal having a local frequency. A first filter extracts a difference frequency signal obtained by the mixing operation of the mixer. A phase difference detection unit makes a comparison between the phase of the difference frequency signal extracted by the first filter and the phase of a reference signal having a reference frequency, and generates a phase difference signal that corresponds to the phase difference. A loop filter performs filtering of the phase difference signal so as to generate the control signal. A second filter extracts a summation frequency signal obtained by the mixing operation of the mixer, and outputs the summation frequency signal via an output terminal thereof.

8 Claims, 6 Drawing Sheets

PLL FREQUENCY SYNTHESIZER

CROSS-REFERENCE TO RELATED APPLICATIONS

This application claims priority to Japanese Patent Application No. 2010-115617 filed on May 19, 2010 the disclosure of which is incorporated herein by reference.

BACKGROUND OF THE INVENTION

1. Field of the Invention

The present invention relates to a PLL (Phase Locked Loop) frequency synthesizer.

2. Description of the Related Art

In order to generate a signal having a desired frequency, a PLL frequency synthesizer is used. Examples of such PLL frequency synthesizers include: an arrangement employing a PLL using a frequency divider; an arrangement including a frequency mixer instead of such a frequency divider; and an arrangement including both the frequency divider and the frequency mixer (see Patent document 1).

Figure 1:
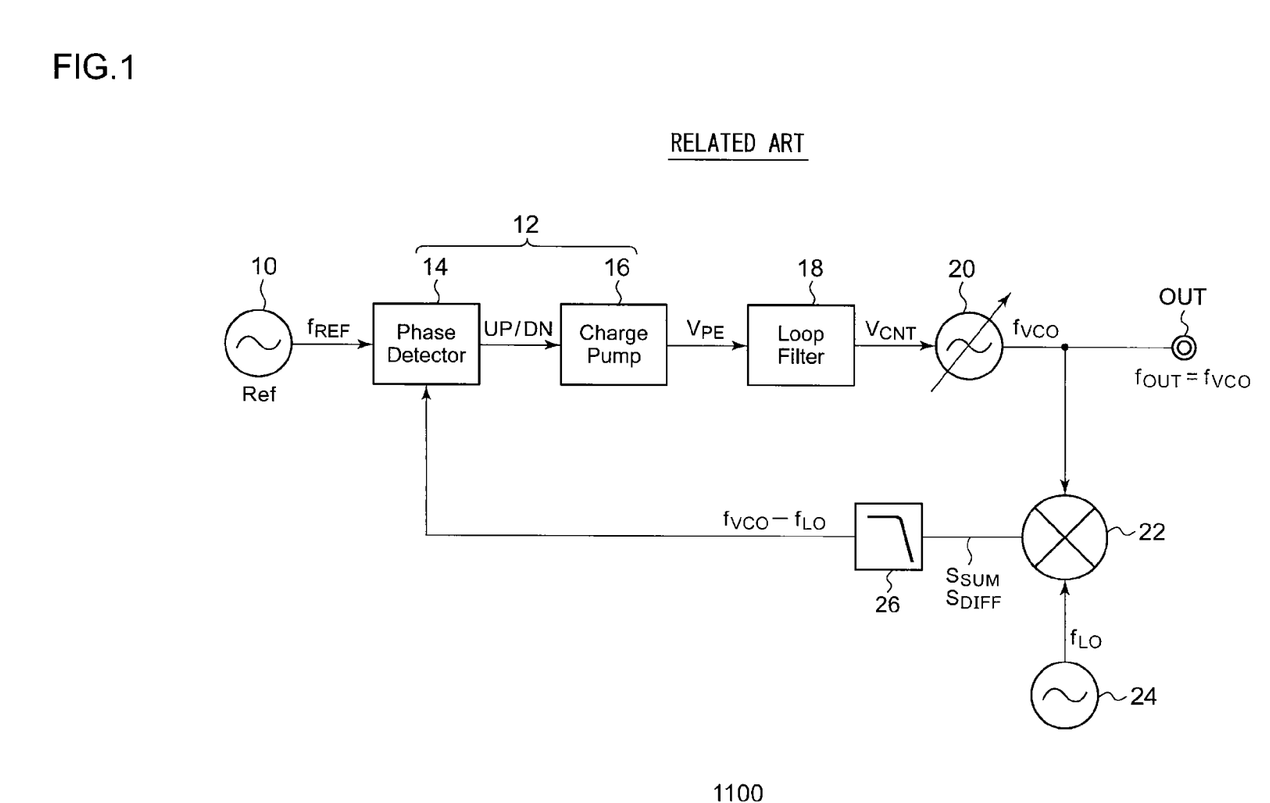
FIG. 1 is a block diagram which shows an example configuration of a PLL frequency synthesizer.

FIG. 1 is a block diagram which shows an example configuration of a PLL frequency synthesizer.

A VCO (voltage controlled oscillator) 20 oscillates at a frequency $f_{VCO}$ according to a control voltage $V_{CNT}$. A local oscillator 24 generates a local signal $S_{LO}$ having a local frequency $f_{LO}$. A mixer 22 performs frequency mixing of an output signal $S_{VCO}$ of the VCO 20 and the local signal $S_{LO}$. The mixing operation of the mixer 22 generates a signal $S_{SUM}$ having a summation frequency $f_{VCO}+f_{LO}$ and a signal $S_{DIFF}$ having a difference frequency $f_{VCO}-f_{LO}$. A filter 26 is configured as a low-pass filter, and extracts the difference frequency signal $S_{DIFF}$ thus mixed by the mixer 22.

A phase difference detection unit 12 makes a comparison between the phase of a reference frequency signal $S_{REF}$ having a reference frequency $f_{REF}$ output from a reference oscillator 10 and the phase of the difference frequency signal $S_{DIFF}$, and generates a phase difference signal $V_{PE}$ that corresponds to the phase difference. Specifically, a phase comparator 14 generates an up/down signal UP/DN according to the phase relation between the reference frequency signal $S_{REF}$ and the difference frequency signal $S_{DIFF}$. A charge pump circuit 16 charges or discharges a capacitor according to the up/down signal UP/DN, and outputs, as a phase difference signal $V_{PE}$, a voltage that develops at the capacitor. A loop filter 18 performs filtering of the phase difference signal $V_{PE}$, and outputs the resulting difference signal as the control voltage $V_{CNT}$ to be supplied to the VCO 20.

A PLL frequency synthesizer 1100 outputs the output signal $S_{VCO}$ of the VCO 20 via an output terminal OUT.

RELATED ART DOCUMENTS

Patent Documents

[Patent Document 1]
Japanese Patent Application Laid Open No. 2000-40959

With such a PLL frequency synthesizer 1100, a feedback loop is formed such that the frequency of the difference frequency signal $S_{DIFF}$, i.e., $f_{VCO}-f_{LO}$, matches the reference frequency $f_{REF}$. Thus, the following Expression (1) holds true.

$$f_{VCO}-f_{LO}=f_{REF} \quad (1)$$

That is to say, the frequency $f_{OUT}$ of the output signal $S_{OUT}$ of the PLL frequency synthesizer 1100 is represented by Expression (2).

$$f_{OUT}=f_{VCO}=f_{LO}+f_{REF} \quad (2)$$

The PLL frequency synthesizer 1100 shown in FIG. 1 generates a signal (phase comparison target signal) $S_{DIFF}$ to be compared with the reference frequency $f_{REF}$ using the mixer 22 instead of a frequency divider. If a 1/N frequency divider is used to generate a phase comparison target signal, the phase noise characteristics of the reference oscillator 10 and the phase comparator 14 become N times worse, which affects the output signal. In contrast, the PLL frequency synthesizer 1100 shown in FIG. 1 employs the mixer 22 instead of such a frequency divider, thereby suppressing such worsening of the phase noise characteristics.

However, with the PLL frequency synthesizer 1100 shown in FIG. 1, $f_{OUT}$ is equal to $f_{VCO}$. Accordingly, such an arrangement requires a VCO configured to oscillate at the same frequency as that of a desired output frequency $f_{OUT}$. In general, as the oscillation frequency of the VCO becomes higher, the phase noise characteristics thereof become poorer. Accordingly, a high output frequency $f_{OUT}$ leads to worsening of the phase noise characteristics of the PLL frequency synthesizer 1100 shown in FIG. 1.

In order to solve such a problem, in some cases, a frequency multiplier configured to multiply the frequency of the output signal $S_{VCO}$ of the VCO 20 by M is arranged as a downstream component of the PLL frequency synthesizer 1100, thereby providing the output frequency represented by the Expression $f_{OUT}=f_{VCO} \times M$. With such an arrangement, the oscillation frequency $f_{VCO}$ of the VCO 20 is 1/M that of an arrangement that does not include such a frequency multiplier. Thus, such an arrangement improves the phase noise characteristics of the VCO 20 itself. However, this phase noise is multiplied by M because of the frequency multiplier which is a downstream component. Accordingly, such an arrangement does not provide sufficiently improved phase noise characteristics.

SUMMARY OF THE INVENTION

The present invention has been made in order to solve such a problem. Accordingly, it is an exemplary purpose of an embodiment of the present invention to provide a PLL frequency synthesizer having improved phase noise characteristics.

An embodiment of the present invention relates to a PLL frequency synthesizer. The PLL frequency synthesizer comprises: a voltage controlled oscillator configured to oscillate at a frequency that corresponds to a control voltage; a local oscillator configured to generate a local signal having a local frequency; a reference signal generator configured to generate a reference signal having a reference frequency; a frequency mixer configured to perform frequency mixing of an output signal of the voltage controlled oscillator and the local signal; a first filter configured to extract a difference frequency signal obtained by the mixing operation of the mixer; a phase difference detection unit configured to make a comparison between the phase of the difference frequency signal extracted by the first filter and the phase of the reference signal, and to generate a phase difference signal that corresponds to the phase difference; a loop filter configured to perform filtering of the phase difference signal so as to generate the control signal; and a second filter configured to extract a summation frequency signal obtained by the mixing operation of the mixer. The PLL frequency synthesizer is configured to output the summation frequency signal.

With such an embodiment, the required oscillation frequency of the voltage controlled oscillator is lower, by the local frequency, than the frequency of the output signal of the PLL frequency synthesizer. Thus, such an arrangement can employ a voltage controlled oscillator having a low oscillation frequency band, i.e., a voltage controlled oscillator having high phase noise performance. This improves the overall phase noise performance of the PLL frequency synthesizer.

Also, a PLL frequency synthesizer according to an embodiment may further comprise a selector configured to receive the summation frequency signal and the output signal of the voltage controlled oscillator, to select one from among the signals thus received, and to output the signal thus selected.

Such an arrangement is capable of switching the frequency of the output signal of the PLL frequency synthesizer.

Also, a PLL frequency synthesizer according to an embodiment may further comprise a frequency divider configured to divide the frequency of the difference frequency signal. Also, the phase difference detection unit may be configured to make a comparison between the phase of the reference signal and the phase of the output signal of the frequency divider instead of the difference frequency signal.

Even if the frequency of the reference signal cannot be sufficiently raised, by dividing the frequency of the difference frequency signal by means of the frequency divider, and by inputting the resulting difference frequency signal to the phase difference detection unit, such an arrangement is capable of operating using the reference signal having such a low frequency. Also, by employing a programmable frequency divider which is capable of controlling the frequency division ratio, such an arrangement is capable of controlling the output frequency according to the frequency division ratio.

Also, the reference signal generator may comprise a DDS (Direct Digital Synthesizer) signal source. Such an arrangement is capable of controlling the reference frequency as desired.

Also, a PLL frequency synthesizer according to an embodiment may further comprise: a first buffer configured to receive an output signal of the voltage controlled oscillator; and a second buffer configured to receive a summation frequency signal from the second filter. Such an arrangement provides improved signal isolation.

It should be noted that any combination of the aforementioned components may be made, and any component of the present invention or any manifestation thereof may be mutually substituted between a method, apparatus, system, and so forth, which are effective as an embodiment of the present invention.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 2:
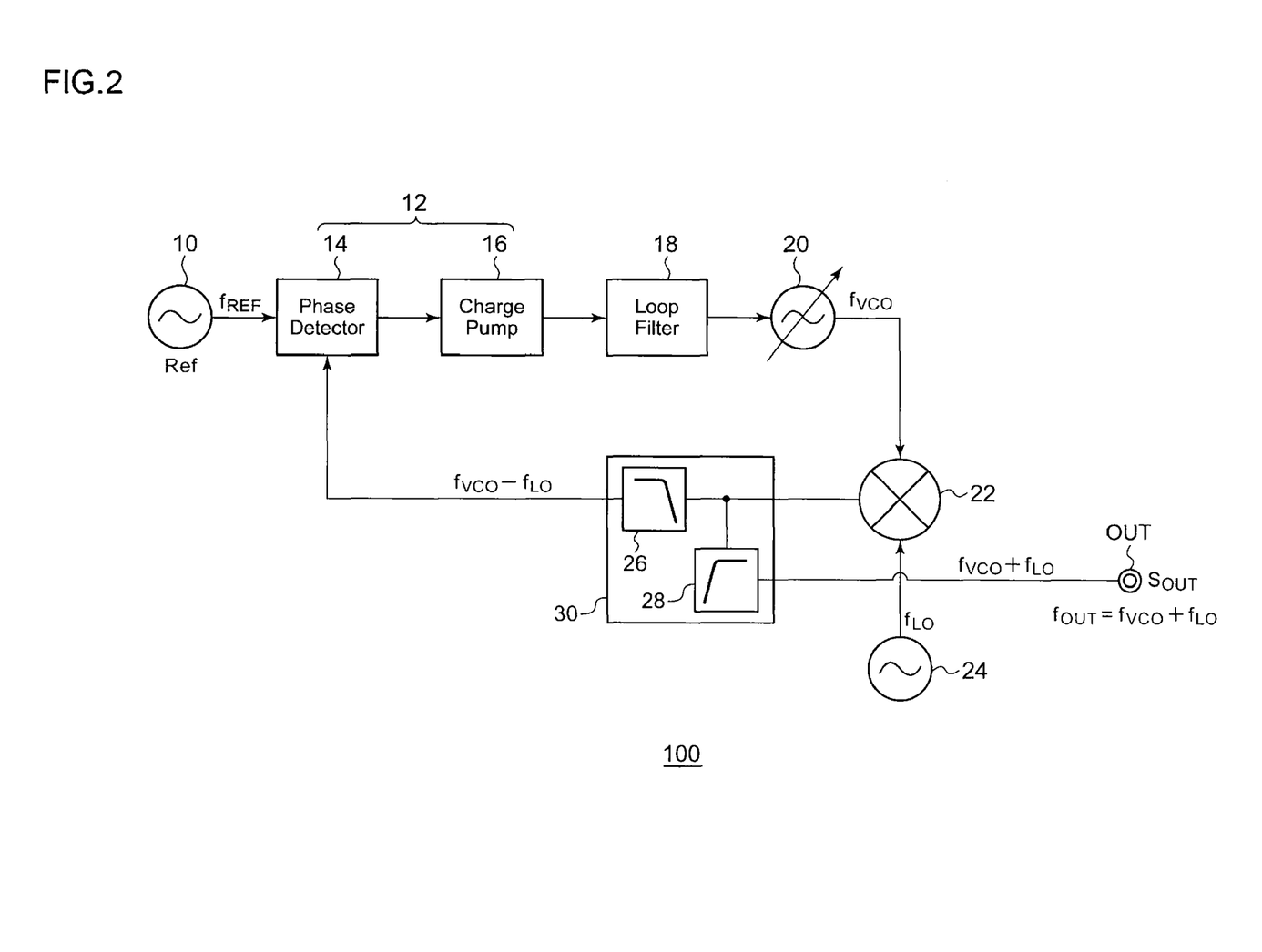
FIG. 2 is a block diagram which shows a PLL frequency synthesizer according to an embodiment.

FIG. 2 is a block diagram which shows a configuration of a PLL frequency synthesizer 100 according to an embodiment. A PLL frequency synthesizer 100 includes a reference oscillator 10, a phase difference detection unit 12, a loop filter 18, a VCO 20, a mixer 22, a local oscillator 24, a first filter 26, and a second filter 28.

The VCO (voltage controlled oscillator) 20 oscillates at a frequency $f_{VCO}$ according to a control voltage $V_{CNT}$. The local oscillator 24 generates a local signal $S_{LO}$ having a local frequency $f_{LO}$. The mixer 22 performs frequency mixing of an output signal $S_{VCO}$ of the VCO 20 and the local signal $S_{LO}$. The mixing operation of the mixer 22 generates a signal $S_{SUM}$ having a summation frequency $f_{SUM}(=f_{VCO}+f_{LO})$ and a signal $S_{DIFF}$ having a difference frequency $f_{DIFF}(=f_{VCO}-f_{LO})$. The first filter 26 removes the summation frequency signal $S_{SUM}$ obtained by the mixing operation of the mixer 22, thereby extracting the difference frequency signal $S_{DIFF}$. For example, the first filter 26 is configured as a low-pass filter having a cutoff frequency that is higher than the difference frequency signal $S_{DIFF}$.

The phase difference detection unit 12 makes a comparison between the phase of a reference frequency signal $S_{REF}$ having a reference frequency $f_{REF}$ output from the reference oscillator 10 and the phase of the difference frequency signal $S_{DIFF}$, and generates a phase difference signal $V_{PE}$ that corresponds to the phase difference. Specifically, a phase comparator 14 generates an up/down signal UP/DN according to the phase relation between the reference frequency signal $S_{REF}$ and the difference frequency signal $S_{DIFF}$. A charge pump circuit 16 charges or discharges a capacitor according to the up/down signal UP/DN, and outputs, as a phase difference signal $V_{PE}$, a voltage that develops at the capacitor. A loop filter 18 performs filtering of the phase difference signal $V_{PE}$, and outputs the resulting difference signal as the control voltage $V_{CNT}$ to be supplied to the VCO 20. It should be noted that the configuration of the phase difference detection unit 12 is not restricted to such a configuration shown in FIG. 2.

The second filter 28 removes the difference frequency $S_{DIFF}$ obtained by the mixing operation of the mixer 22, thereby extracting the summation frequency signal $S_{SUM}$. For example the second filter 28 is configured as a high-pass filter having a cutoff frequency that is lower than the summation frequency $f_{SUM}$. The first filter 26 and the second filter 28 can be understood as constituting a diplexer or a branching filter (30).

The PLL frequency synthesizer 100 outputs, via the output terminal OUT, the summation frequency signal $S_{SUM}$ thus extracted by the second filter 28. That is to say, the output frequency $f_{OUT}$ of the PLL frequency synthesizer 100 is represented by the following Expression.

$$f_{OUT}=f_{SUM}=f_{VCO}+f_{LO} \quad (3)$$

The above is the configuration of the PLL frequency synthesizer 100. Next, description will be made regarding the operation thereof.

Figure 3:
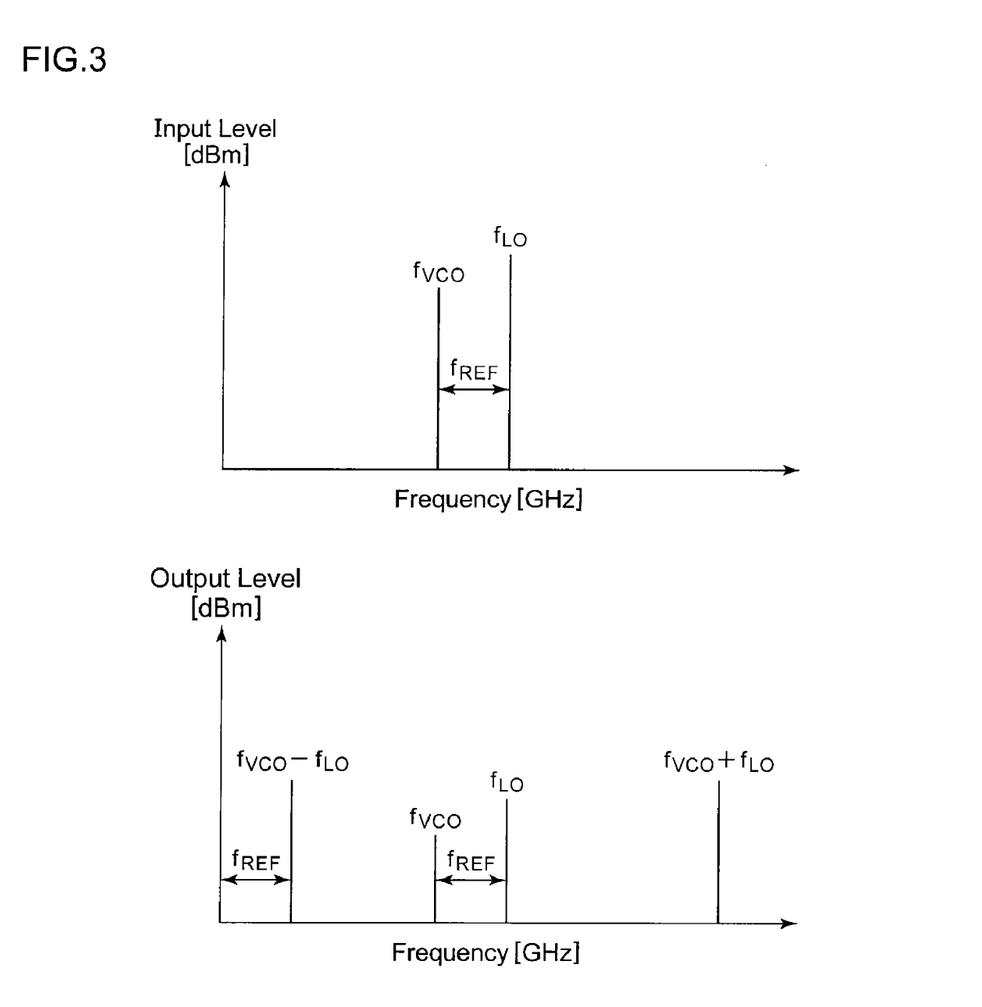
FIG. 3 shows graphs each showing input/output characteristics of a mixer.

FIG. 3 shows graphs which each represent the input/output characteristics of the mixer 22. The upper graph shows the magnitudes of the $S_{VCO}$ and the local signal $f_{LO}$, which are input signals. The lower graph shows the magnitudes of the summation frequency signal $S_{SUM}$ and the difference frequency signal $S_{DIFF}$ generated by the mixing operation.

By means of the feedback loop operation of the PLL frequency synthesizer 100, the frequency (phase) is locked such that the relation $f_{REF}=f_{DIFF}$ is satisfied, i.e., such that the following Expression (4) holds true.

$$f_{REF}=f_{VCO}-f_{LO} \quad (4).$$

By transformation of Expression (4), the following Expression (5) can be obtained.

$$f_{VCO}=f_{REF}+f_{LO} \quad (5)$$

Expression (5) is substituted into Expression (3), whereby the output frequency $f_{OUT}$ is represented by the following Expression (6).

$$f_{OUT}=f_{REF}+2\times f_{LO} \quad (6)$$

For example, the reference frequency $f_{REF}$ is taken to be on the order of several hundred MHz. Here, the reference frequency $f_{REF}$ is taken to be 200 MHz. If the local frequency $f_{LO}$ is 2 GHz, the oscillation frequency $f_{VCO}$ of the VCO 20 is calculated as 2.2 GHz using Expression (5).

Moreover, the frequency of the summation frequency signal $S_{SUM}$ obtained by mixing the output signal $S_{VCO}$ of the VCO 20 and the local signal $S_{LO}$, i.e., the frequency $f_{OUT}$ of the output signal $S_{OUT}$ of the PLL frequency synthesizer 100, is calculated as follows using Expression (6).

$$f_{OUT}=0.2+2\times 2=4.2 \text{ GHz}.$$

The advantage of the PLL frequency synthesizer 100 shown in FIG. 2 can be clearly understood in comparison with the PLL frequency synthesizer 1100 shown in FIG. 1. The output frequency $f_{OUT}$ of the PLL frequency synthesizer 1100 shown in FIG. 1 is represented by Expression (2). That is to say, with the PLL frequency synthesizer 1100 shown in FIG. 1 receiving a supply of the reference frequency $f_{REF}=200$ MHz, in order to provide an output frequency $f_{OUT}=4.2$ GHz, there is a need to set $f_{LO}$ to 4 GHz, and to set $f_{VCO}$ to 4.2 GHz.

In contrast, the PLL frequency synthesizer 100 shown in FIG. 2 provides a higher output frequency $f_{OUT}$ that is twice or more the oscillation frequency $f_{VCO}$ of the VCO 20. In other words, such an arrangement requires the oscillation frequency $f_{VCO}$ of the VCO 20 to be on the order of only half the output frequency $f_{OUT}$.

As the oscillation frequency of the VCO 20 becomes higher, the phase noise characteristics of the VCO 20 become poorer. With the PLL frequency synthesizer 100 shown in FIG. 2, the oscillation frequency of the VCO 20 can be reduced to be on the order of half that of an arrangement shown in FIG. 1. Thus, such an arrangement dramatically improves the phase noise characteristics.

The local frequency $f_{LO}$ used in an arrangement shown in FIG. 1 is 4 GHz. In contrast, an arrangement shown in FIG. 2 uses a local frequency $f_{LO}$ that is reduced to 2 GHz. The phase noise characteristics depend on the configuration of the local oscillator 24. However, in general, as the oscillation frequency of an oscillator becomes higher, the phase noise characteristics thereof become poorer. Thus, the PLL frequency synthesizer 100 shown in FIG. 2 provides improved phase noise characteristics of the local signal $S_{LO}$ in comparison with an arrangement shown in FIG. 1. As a result, such an arrangement provides improved phase noise characteristics of the output signal $S_{OUT}$, which is obtained by performing mixing processing on the local signal $S_{LO}$.

It should be noted that the PLL frequency synthesizer 1100 shown in FIG. 1 does not require the summation frequency component provided by the mixer 22. Accordingly, with such an arrangement, the mixer 22 is designed such that the gain becomes high at the difference frequency $f_{DIFF}$. In contrast, it should be noted that, with the PLL frequency synthesizer 100 shown in FIG. 2, the gain of the mixer 22 is designed so as to obtain a summation frequency $f_{SUM}$ that has a necessary level.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such a modification.

Figure 4:
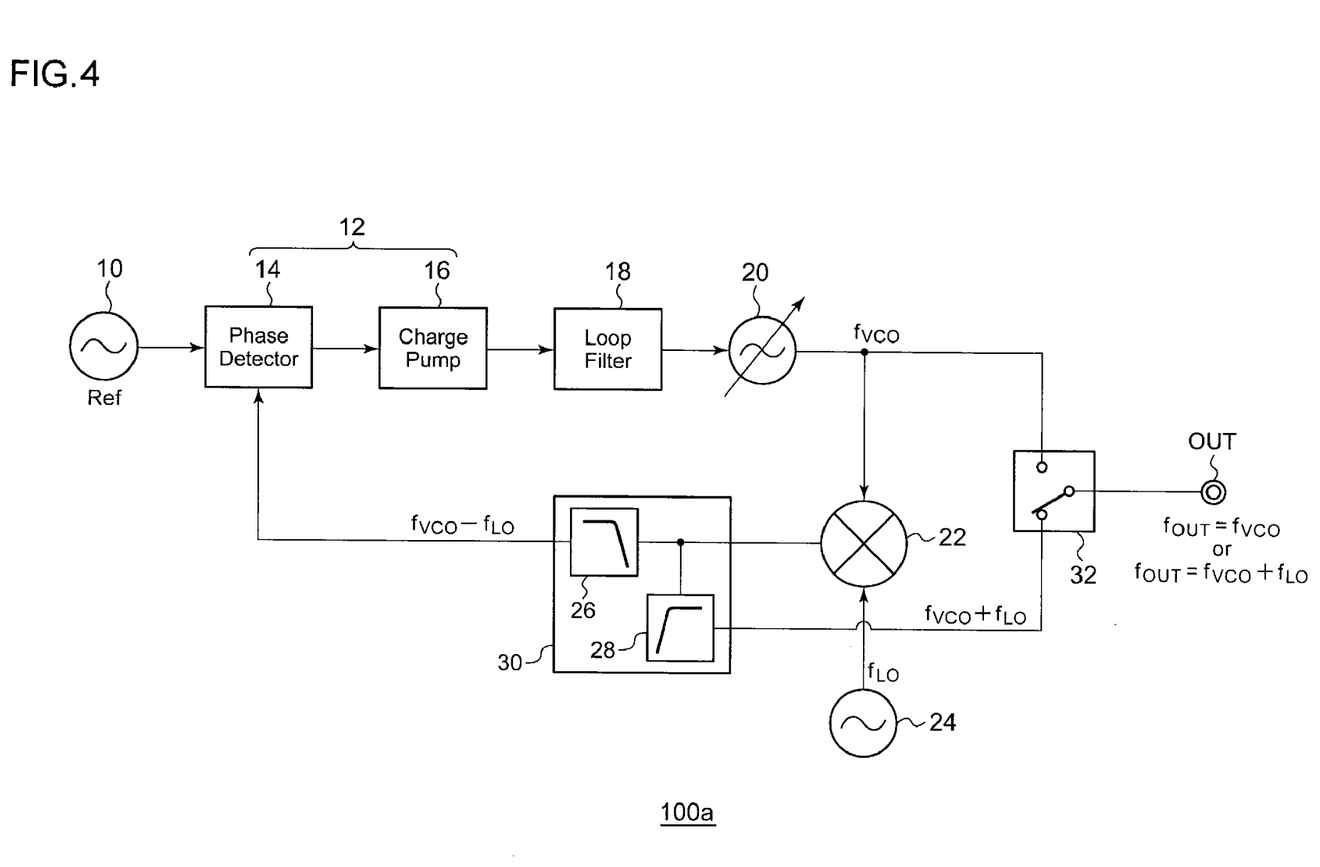
FIG. 4 is a block diagram which shows a configuration of a PLL frequency synthesizer according to a first modification.

FIG. 4 is a block diagram which shows a configuration of a PLL frequency synthesizer 100a according to a first modification. The PLL frequency synthesizer 100a further includes a selector 32 in addition to the components of the PLL frequency synthesizer 100 shown in FIG. 2.

The selector 32 has two input terminals, and arranged such that the output signal $S_{VCO}$ of the VCO 20 is input to one terminal thereof, and the output signal of the second filter 28, i.e., the summation frequency signal $S_{SUM}$ is input to the other terminal thereof. The output terminal of the selector 32 is connected to the output terminal OUT of the PLL frequency synthesizer 100a.

The PLL frequency synthesizer 100a is capable of switching the output frequency $f_{OUT}$ between the output frequency of the PLL frequency synthesizer 100 shown in FIG. 2, i.e., $f_{VCO}$, and the output frequency of the PLL frequency synthesizer 1100 shown in FIG. 1, i.e., $(f_{VCO}+f_{LO})$.

Figure 5:
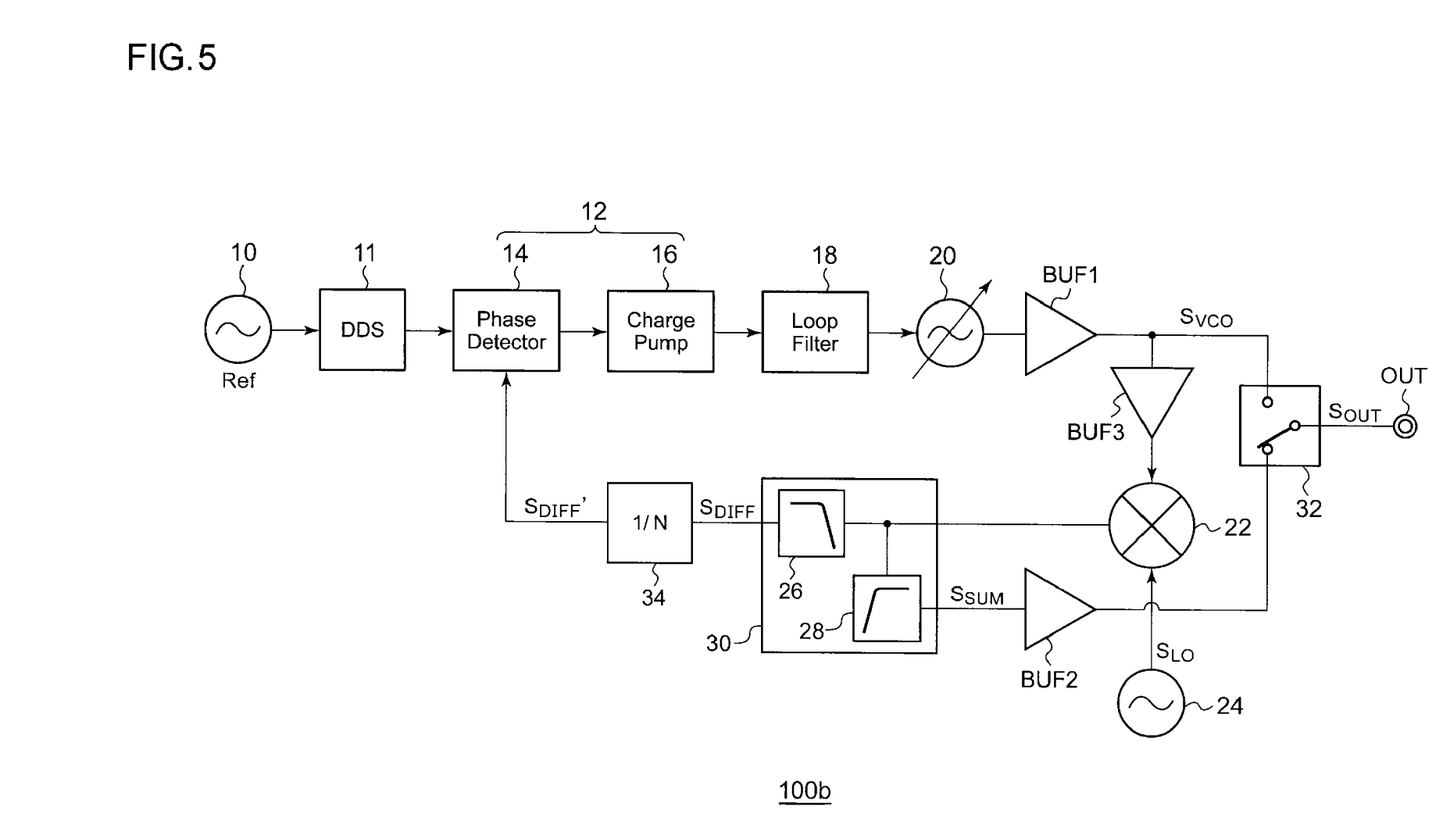
FIG. 5 is a block diagram which shows a configuration of a PLL frequency synthesizer according to a second modification.

FIG. 5 is a block diagram which shows a configuration of a PLL frequency synthesizer 100b according to a second modification. With the PLL frequency synthesizer 100b shown in FIG. 5, the reference signal $S_{REF}$ is not directly obtained by the reference oscillator 10, but is generated via a DDS (Direct Digital Synthesizer) signal source 11. Thus, such an arrangement is capable of controlling the reference frequency $f_{REF}$, thereby controlling the output frequency $f_{OUT}$.

Furthermore, the PLL frequency synthesizer 100b includes a frequency divider 34 as a component downstream of the first filter 26. The frequency divider 34 divides the frequency of the output signal (difference frequency signal $S_{DIFF}$) of the first filter 26 by N, and outputs the resulting signal to the phase difference detection unit 12. The phase difference detection unit 12 makes a comparison between the phase of the reference signal $S_{REF}$ and the phase of the output signal $S_{DIFF}'$ of the frequency divider 34, instead of the difference frequency signal $S_{DIFF}$. With such an arrangement including the frequency divider 34, the feedback operation is performed such that the relation $f_{REF}=f_{DIFF}/N=(f_{VCO}-f_{LO})/N$ holds true. That is to say, the relation $f_{VCO}=N\times f_{REF}+f_{LO}$ holds true. By providing the frequency divider 34, the reference frequency $f_{REF}$ required to provide the same output frequency $f_{OUT}$ can be reduced in comparison with an arrangement that does not include such a frequency divider 34.

Also, the frequency divider 34 may be configured as a programmable frequency divider which is capable of controlling the frequency division ratio (1/N). Such an arrangement is capable of controlling the output frequency $f_{OUT}$ according to the frequency division ratio.

The PLL frequency synthesizer 100b further includes a first buffer BUF1 through a third buffer BUF3.

The first buffer BUF1 is inserted as a component downstream of the VCO 20. The second buffer BUF2 is inserted as a component downstream of the second filter 28. The third buffer BUF3 is inserted between the first buffer BUF1 and the mixer 22. By providing the buffers BUF1 through BUF3, such an arrangement provides improved circuit isolation.

It is needless to say that each of such additional circuit components may be employed singly. Also, any combination thereof may be made.

FIG. 6 shows diagrams each showing a modification of the combination of the first filter 26 and the second filter 28. The combination of the first filter 26 and the second filter 28 shown in FIG. 6A is the same as that shown in FIG. 2.

Figure 6A:
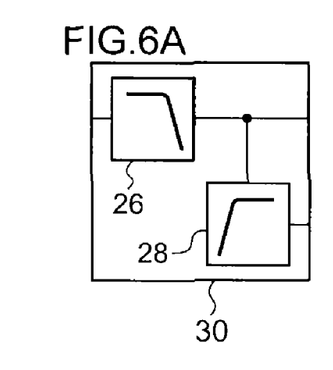
FIG. 6 show modifications of a combination of a first filter and a second filter.
Figure 6B:
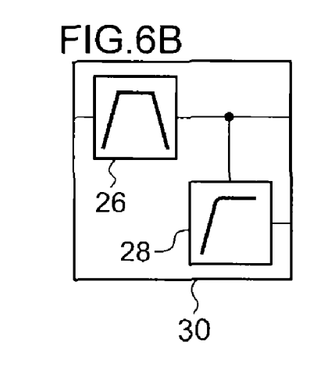

The first filter 26 shown in FIG. 6B is configured as a bandpass filter having a pass band frequency tuned to match the difference frequency $f_{DIFF}$. The second filter 28 is configured as a high-pass filter. With such an arrangement in which the first filter 26 is configured as such a bandpass filter, the frequency component lower than the difference frequency $f_{DIFF}$ can be removed from the feedback loop operation. Thus, such an arrangement effectively operates even if the low-frequency component leads to deterioration in performance.

Figure 6C:
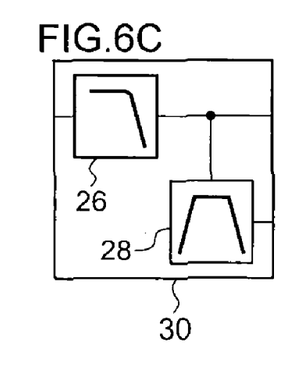

The first filter 26 shown in FIG. 6C is configured as a low-pass filter. The second filter 28 is configured as a bandpass filter having a pass band frequency tuned to match the summation frequency $f_{SUM}$. With such an arrangement in which the second filter 28 is configured as such a bandpass filter, such an arrangement prevents a high-frequency signal component (i.e., noise) that is higher than the summation frequency $f_{SUM}$ from leaking from the output terminal OUT.

Figure 6D:
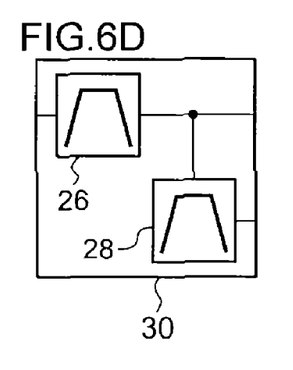

FIG. 6D shows an arrangement in which the first filter 26 and the second filter 28 are each configured as a bandpass filter. Such an arrangement provides both the advantages described above with reference to FIGS. 6B and 6C.

Description has been made regarding an arrangement in which the difference frequency signal $S_{DIFF}$ to be fed back to the phase difference detection unit 12 has a frequency represented by $f_{DIFF}=f_{VCO}-f_{LO}$. However, the present invention is not restricted to such an arrangement. Also, an arrangement may be made in which the difference frequency signal $S_{DIFF}$ has a frequency $f_{DIFF}$ represented by $f_{DIFF}=f_{LO}-f_{VCO}$. With such an arrangement, the frequency feedback operation is performed such that the relation $f_{LO}-f_{VCO}=f_{REF}$ holds true.

While the preferred embodiments of the present invention have been described using specific terms, such description is for illustrative purposes only, and it is to be understood that changes and variations may be made without departing from the spirit or scope of the appended claims.

What is claimed is:

1. A PLL frequency synthesizer comprising:
    a voltage controlled oscillator configured to oscillate at a frequency that corresponds to a control voltage;
    a local oscillator configured to generate a local signal having a local frequency;
    a reference signal generator configured to generate a reference signal having a reference frequency;
    a frequency mixer configured to perform frequency mixing of an output signal of the voltage controlled oscillator and the local signal;
    a first filter configured to extract a difference frequency signal obtained by the mixing operation of the mixer;
    a phase difference detection unit configured to make a comparison between the phase of the difference frequency signal extracted by the first filter and the phase of the reference signal, and to generate a phase difference signal that corresponds to the phase difference;
    a loop filter configured to perform filtering of the phase difference signal so as to generate the control signal; and
    a second filter configured to extract a summation frequency signal obtained by the mixing operation of the mixer,
    wherein the PLL frequency synthesizer is configured to output the summation frequency signal.

2. A PLL frequency synthesizer according to claim 1, further comprising a selector configured to receive the summation frequency signal and the output signal of the voltage controlled oscillator, to select one from among the signals thus received, and to output the signal thus selected.

3. A PLL frequency synthesizer according to claim 1, further comprising a frequency divider configured to divide the frequency of the difference frequency signal,
    wherein the phase difference detection unit is configured to make a comparison between the phase of the reference signal and the phase of the output signal of the frequency divider instead of the difference frequency signal.

4. A PLL frequency synthesizer according to claim 2, further comprising a frequency divider configured to divide the frequency of the difference frequency signal,
    wherein the phase difference detection unit is configured to make a comparison between the phase of the reference signal and the phase of the output signal of the frequency divider instead of the difference frequency signal.

5. A PLL frequency synthesizer according to claim 1, wherein the reference signal generator comprises a DDS (Direct Digital Synthesizer) signal source.

6. A PLL frequency synthesizer according to claim 2, wherein the reference signal generator comprises a DDS (Direct Digital Synthesizer) signal source.

7. A PLL frequency synthesizer according to claim 1, further comprising:
    a first buffer configured to receive an output signal of the voltage controlled oscillator; and
    a second buffer configured to receive a summation frequency signal from the second filter.

8. A PLL frequency synthesizer according to claim 2, further comprising:
    a first buffer configured to receive an output signal of the voltage controlled oscillator; and
    a second buffer configured to receive a summation frequency signal from the second filter.

* * * * *